US006852618B2

(12) United States Patent
Chopra

(10) Patent No.: US 6,852,618 B2
(45) Date of Patent: Feb. 8, 2005

(54) COMBINED BARRIER LAYER AND SEED LAYER

(75) Inventor: Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 275 days.

(21) Appl. No.: 09/838,493

(22) Filed: Apr. 19, 2001

(65) Prior Publication Data

US 2002/0173137 A1 Nov. 21, 2002

(51) Int. Cl.$^7$ .......................................... H01L 21/4763
(52) U.S. Cl. ...................... 438/618; 438/628; 438/637
(58) Field of Search ................................ 438/618, 628, 438/637, 683, 687, 686

(56) References Cited

U.S. PATENT DOCUMENTS

| | | | |
|---|---|---|---|
| 5,151,168 A | 9/1992 | Gilton et al. ............... 205/123 |
| 5,456,819 A * | 10/1995 | Lashmore et al. .......... 205/212 |
| 5,804,090 A * | 9/1998 | Iwasaki et al. .............. 216/99 |
| 5,877,069 A | 3/1999 | Robinson .................... 438/441 |
| 5,893,966 A | 4/1999 | Akram et al. ............... 205/137 |
| 5,933,758 A | 8/1999 | Jain ............................. 438/687 |
| 6,077,412 A | 6/2000 | Ting et al. ................... 205/143 |
| 6,221,763 B1 | 4/2001 | Gilton ........................ 438/643 |
| 6,261,954 B1 * | 7/2001 | Ho et al. ..................... 438/687 |
| 6,273,786 B1 | 8/2001 | Chopra et al. ................ 451/28 |
| 6,284,652 B1 * | 9/2001 | Charneski et al. .......... 438/653 |
| 6,413,858 B1 | 7/2002 | Chopra ....................... 438/643 |
| 6,436,257 B1 * | 8/2002 | Babas-Dornea et al. .... 204/415 |
| 6,489,235 B2 | 12/2002 | Gilton et al. ............... 438/643 |
| 6,545,357 B2 | 4/2003 | Chopra ....................... 257/751 |
| 6,555,909 B1 * | 4/2003 | Lopatin et al. .............. 257/751 |
| 6,613,671 B1 | 9/2003 | Chopra et al. ............... 438/687 |
| 6,632,345 B1 * | 10/2003 | Chen .......................... 205/182 |
| 2002/0100693 A1 * | 8/2002 | Lu et al. | |
| 2002/0134684 A1 * | 9/2002 | Calvert et al. | |

FOREIGN PATENT DOCUMENTS

JP          2000351622      * 12/2000     ........... C01G/23/00

OTHER PUBLICATIONS

Braun, Alexander.E. ,"Aluminum Persists as Copper Age Dawns", *Semiconductor International* vol. 22, No. 9, (Aug. 1999),58–60, 63, 64, 66.

Braun, Alexander.E. ,"Copper Electroplating Enters Mainstream Processing", *Semiconductor International*, vol. 22, No. 4, (Apr. 1999),58–60, 62, 64, 66.

Dorsch, Jeff, "Applied Does Quick Turnaround on CU Process", *Electronic News(1991)*, (Nov. 8, 1999),36.

* cited by examiner

*Primary Examiner*—W. David Coleman
*Assistant Examiner*—Khiem Nguyen
(74) *Attorney, Agent, or Firm*—Schwegman, Lundberg, Woessner & Kluth, P.A.

(57) ABSTRACT

Methods and apparatus for forming conductive interconnect layers useful in articles such as semiconductor chips, memory devices, semiconductor dies, circuit modules, and electronic systems. The number of necessary processing steps to form conductive interconnects are reduced by removing the need to employ a seed layer interposed between the barrier layer and the conductive interconnect layer. This is accomplished in part through the electrochemical reduction of oxides on a dual-purpose layer. The present invention can be advantageously utilized to deposit copper interconnects onto tungsten.

54 Claims, 6 Drawing Sheets

COMBINED BARRIER LAYER AND SEED LAYER

TECHNICAL FIELD

The present invention relates generally to the fabrication of semiconductor devices. More particularly, the present invention relates to the formation of dual-purpose layers that serve as both barrier and seed layers for electrochemical deposition of conductive interconnect materials.

BACKGROUND

The need for high performance semiconductor chips has continued to increase over the past several years. As demand for better performance and faster semiconductor chips has grown, so have efforts to reduce semiconductor chip size. Reducing the size of individual integrated circuit components can dramatically increase the speed and performance of a semiconductor chip. For example, smaller gate lengths in MOS transistors dramatically increase their switching speed.

The performance of semiconductor chips is limited by the electrical conductivity of the metal interconnects that electrically connect the various components that form the integrated circuits on the semiconductor chip. Therefore, in order to take full advantage of transistors that are capable of operating at faster speeds, the electrical interconnects must be highly conductive, yet low in resistance. Aluminum or an aluminum alloy was widely used as the preferred material for forming conductive interconnects by a process known as "metallization". "Metallization" is a term used in the semiconductor industry to describe the process of wiring together the components of an integrated circuit, and typically occurs by the process of electrochemical deposition. Aluminum emerged as the preferred metal for metallization because it has a relatively low resistivity, good current-carrying density, and superior adhesion to silicon dioxide. In addition, aluminum is available in high purity and has a natural low contact resistance with silicon.

However, aluminum and aluminum alloys present some disadvantages when used to make interconnects. For example, although aluminum has a resistance that can be tolerated by most integrated circuits, it is difficult to deposit in a high aspect ratio. In addition, aluminum and aluminum alloys suffer from eutectic formations, thermally induced voiding, and electromigration when used in very large scale integration (VLSI) and ultra large scale integration (ULSI) semiconductor chips.

Recently, copper metal has begun to replace aluminum and aluminum-silicon alloys in VLSI and ULSI metallization processes. Copper has better conductivity and is more reliable than aluminum or aluminum alloys. The use of copper for making semiconductor chip interconnects is appealing because of the low cost, high throughput, excellent via-filling capabilities, and high quality of the deposited copper film. In contrast to aluminum, copper is capable of being deposited with high aspect ratios. Copper is also a much better conductor than aluminum, provides good step coverage, is more resistant to electromigration and can be electrochemically deposited at low temperatures.

Because copper will diffuse into silicon if applied directly to a silicon-containing substrate, such as a silicon wafer, it is necessary to first apply a barrier layer between the substrate from which the semiconductor chip is fabricated and the copper layer. Additionally, the material must have a relatively low resistivity so that electrochemical deposition of copper on the surface of the barrier layer will occur. Unless the resistivity of the barrier material is relatively low, it will not function as a suitable surface for subsequent electrochemical deposition of the conductive interconnect material. Tantalum, for example, has a resistivity that is two orders of magnitude higher than copper. Accordingly, tantalum is generally not suitable to serve as the cathode during the electrochemical deposition process.

To overcome this resistivity concern, a seed layer is typically formed on top of the barrier layer to provide the desired resistivity. For the electrochemical deposition of copper, the seed layer is often a layer of PVD copper. Unfortunately, formation of the seed layer overlying the barrier layer necessarily adds a discrete process step.

Accordingly, there continues to be a need in the industry for improved methods and devices for forming conductive layers, such as used in device interconnects, onto barrier layers.

SUMMARY

These and other needs are addressed by the present invention which relates to the forming of conductive interconnect layers such as those found in semiconductor devices. The present invention reduces the number of necessary processing steps to form interconnects by removing the need to employ a separate seed layer interposed between the barrier layer and the conductive interconnect layer. This is accomplished in part through the utilization of a barrier material that can be metallized without the need for a seed layer.

In one embodiment, the present invention is a semiconductor comprising a conductive interconnect layer electrochemically deposited onto a dual-purpose layer. By dual-purpose layer, it is meant that the dual-purpose layer functions as both a barrier layer and a seed layer. Dual-purpose layers of the present invention reduce diffusion of conductive interconnect material sufficiently to serve as a barrier layer. Dual-purpose layers of the present invention also exhibit a resistivity sufficiently low to serve as a seed layer, allowing effective electrochemical deposition of the conductive interconnect layer onto the dual-purpose layer. In one embodiment, the material comprising the dual-purpose layer contains tungsten.

In one embodiment of the present invention, a method for metallizing a silicon wafer is provided. A dual-purpose layer is deposited on the surface of the silicon wafer. Next, oxides on the dual-purpose layer are electrochemically reduced in an electrochemical reaction cell. A layer of conductive interconnect material is then electrochemically deposited onto the dual-purpose layer. Tungsten can be utilized to create a dual-purpose layer and copper can be used as the conductive interconnect material. Thus, in one preferred embodiment of the present invention, tungsten interconnects are deposited onto tungsten.

In another embodiment, a first electrolyte is utilized to electrochemically reduce oxides on a dual-purpose layer and a second electrolyte is utilized to electrochemically deposit the conductive interconnect material onto the dual-purpose layer. The electrochemical deposition of the conductive interconnect material can be performed by discharging the first electrolyte from the electrochemical reaction cell after the electrochemical reduction of oxides and replacing it with the second electrolyte. Alternatively, the electrochemical deposition of the conductive interconnect material can be performed in a separate electrochemical reaction cell by transferring the substrate after the reduction of oxides to the separate electrochemical reaction cell.

In another embodiment, a single electrolyte is utilized in an electrochemical reaction cell to both electrochemically reduce the oxides on the dual-purpose layer and electrochemically deposit the conductive interconnect material onto the dual-purpose layer. The single electrolyte comprises the cation of the conductive interconnect material, a counterion, a complexing agent, and a pH control agent.

In other embodiments of the present invention, conductive interconnects according to the present invention are advantageously utilized to produce articles such as semiconductor chips, memory devices, semiconductor dies, circuit modules, and electronic systems.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DESCRIPTION OF THE EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The term substrate used in the following description refers to any structure having an exposed surface onto which structures of the present invention are to be formed. For example, the term substrate includes any structure onto which a barrier layer may be effectively deposited. The term substrate should be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The term substrate is understood to include semiconductor wafers. The term workpiece will also refer to semiconductor structures during processing, and may include other layers that have been fabricated thereupon. The term conductor is understood to include semiconductors, and the term insulator is defined to include any material that is less electrically conductive than the materials referred to as conductors. The following detailed description is, therefore, not to be taken in a limiting sense.

Electroplating Methods

Figure 1:
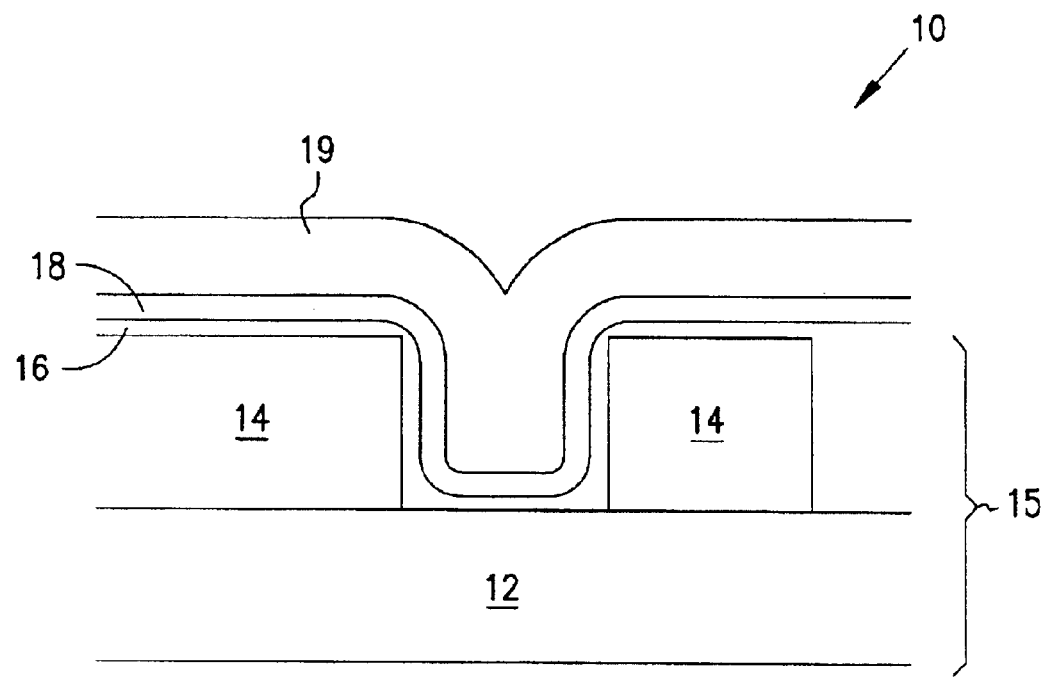
FIG. 1 illustrates cross-sectional view of a metallized workpiece according to the prior art.

FIG. 1 illustrates a cross-sectional view of a metallized workpiece 10 according to the prior art. The workpiece 10 includes a wafer 12, an overlying dielectric layer 14, a barrier layer 16, a seed layer 18, and a conductive interconnect layer 19. The conductive interconnect layer 19 may be referred to as a metal layer. As known in the art, the workpiece 10, at this particular stage of manufacturing, may include a variety of integrated circuit components that were formed in earlier fabrication steps. The dielectric layer 14 is deposited on the surface of the wafer 12 using methods known in the art, such as chemical vapor deposition (CVD), plasma-enhanced chemical vapor deposition (PECVD), spin-on depositing or by thermal oxidation. The dielectric layer 14 can be selected from a variety of dielectric materials, but is preferably made from silicon dioxide or some variation of silicon dioxide. Once a dielectric layer 14 is deposited it typically is patterned using techniques known in the art such as etching. This patterning of the dielectric layer 14 creates what are generally referred to in the industry as trenches. The deposited and patterned dielectric layer 14 on the wafer 12 forms a substrate 15. Once a dielectric layer 14 is deposited and patterned, a barrier layer 16 is deposited on the substrate 15 using techniques known in the art. Next a seed layer 18 is deposited using techniques known in the art. Finally, the metal layer 19 is deposited utilizing techniques known in the art, filling the trenches.

Figure 2:
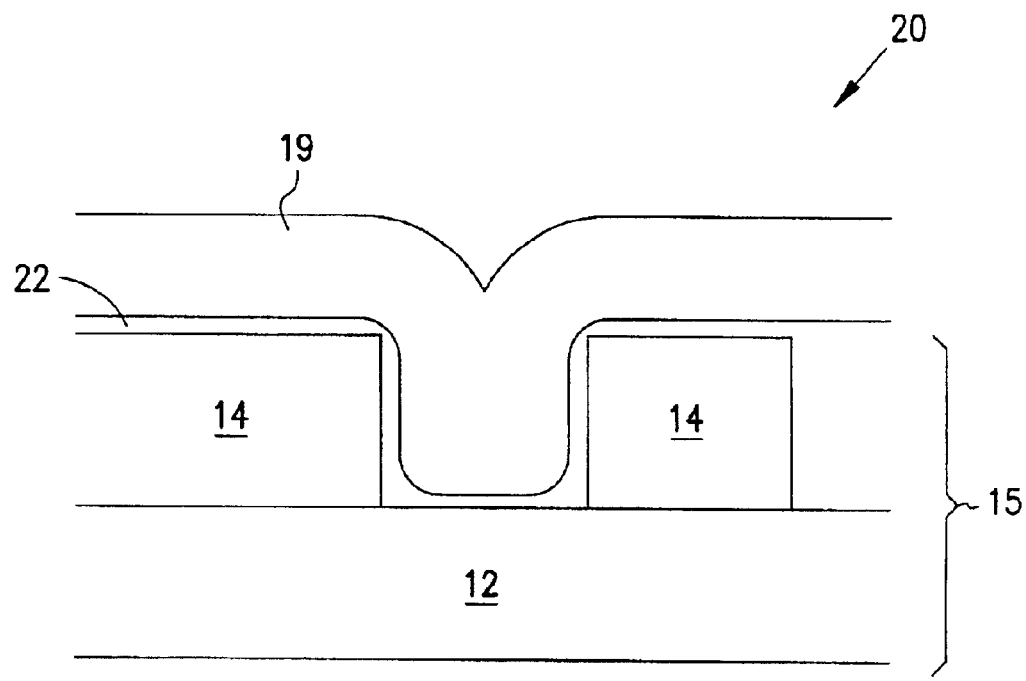
FIG. 2 illustrates an embodiment of the present invention.

FIG. 2 illustrates an embodiment of the present invention. In FIG. 2, the dielectric layer 14 has been deposited onto the wafer 12 and patterned in the same manner as described in reference to FIG. 1. Once the dielectric layer 14 has been deposited on the wafer 12 and patterned, a dual-purpose layer 22 is deposited on the substrate 15. The dual-purpose layer 22 can be deposited utilizing the same techniques known in the art for depositing the barrier layer 16. Oxides are removed from the dual-purpose layer 22 and the metal layer 19 is then deposited onto the dual-purpose layer 22 in accordance with methods of the present invention. Thus, whereas a workpiece 10 of the prior art contains both a barrier layer 16 and a seed layer 18, the present invention provides for only a single dual-purpose layer 22.

By dual-purpose layer, it is meant that the dual-purpose layer functions as both a barrier layer and a seed layer. Dual-purpose layers of the present invention reduce electromigration of conductive interconnect material sufficiently to serve as a barrier layer. Dual-purpose layers of the present invention also exhibit a resistivity sufficiently low to serve as a seed layer, allowing effective electrochemical deposition of the conductive interconnect layer onto the dual-purpose layer.

Materials that can be used to make the dual-purpose layer are referred to herein as dual-purpose materials. Preferred dual-purpose materials can be deposited on substrates by techniques known in the art. In one embodiment of the present invention, the dual-purpose material contains tungsten. These tungsten-containing, dual-purpose materials include, for example, tungsten (W), tungsten nitride ($WN_x$), and tungsten-silicon nitride ($WSiN_x$). A preferred dual-purpose material is tungsten. Tungsten is a refractory metal that has a melting point of 3370° C. and a bulk resistivity of 52 $\mu\Omega$-cm at room temperature. A dual-purpose layer 22 of tungsten may be deposited on a silicon wafer 12 using several deposition techniques known in the art such as evaporation, ion-metal plasma (IMP), chemical vapor deposition (CVD), low pressure CVD, or physical vapor deposition (PVD). A frequently used method for the deposition of tungsten is the reduction of tungsten hexafluoride ($WF_6$) by hydrogen (H) or silane ($SiH_4$).

Dual-purpose materials can be susceptible to oxidation, causing oxides to form on the surface of the dual-purpose layer. These oxides can inhibit the deposition of conductive interconnect material onto the surface of the dual-purpose layer. For example, when tungsten is exposed to air or moisture, it can be oxidized to tungsten dioxide ($WO_2$), tungsten trioxide ($WO_3$), or tungsten pentoxide ($W_2O_5$). Tungsten oxides are not readily removed by rinsing or washing steps because they are not readily dissolved in acidic solutions such as are commonly used in the electrochemical deposition process. These oxides can inhibit the nucleation of copper, resulting in poor adhesion of copper as a conductive interconnect material.

As indicated, conductive interconnect material may not adhere well to the exposed regions of the dual-purpose layer if oxides are present. Thus, according to the present invention, an electrochemical reduction step is employed to remove oxides from the exposed surface of the dual-purpose layer. The electrochemical reduction of oxides on the surface of the dual-purpose layer requires the use of an electrochemical reaction cell. The basic design and operation of electrochemical reaction cells is well known in the art and includes various inlets and outlets for the introduction of gases and liquids, a cathode, an anode, a current source, and an electrolyte. The electrolyte is a medium capable of conducting electricity. Typically, the electrolyte is an aqueous solution. The electrolyte frequently contains metal ions or salts of metals. The cathode, the anode and the substrate are immersed in the electrolyte. A current is then provided to the electrolyte, by providing an electrical potential across the anode and the cathode.

In one embodiment of the present invention, a first process for reducing oxides on the surface of a dual-purpose layer is performed utilizing one electrolyte and then a second process for depositing conductive interconnect material onto the dual-purpose layer is performed utilizing a second electrolyte. The two processes can be performed utilizing the same electrochemical reaction cell by changing electrolytes after the oxide reduction process and before deposition of the conductive interconnect material. The two processes can be performed using a single anode or two different anodes. Alternatively, the two processes can be preformed in two separate electrochemical reaction cells by performing the oxide reduction process in one cell and then transferring the workpiece to a second cell in which the deposition process is performed. The transferring of the workpiece is performed in a manner that does not allow oxides to reform on the surface of the workpiece. In another embodiment of the present invention, a single electrolyte is utilized for both the oxide reduction process and the copper deposition process.

Figure 3:
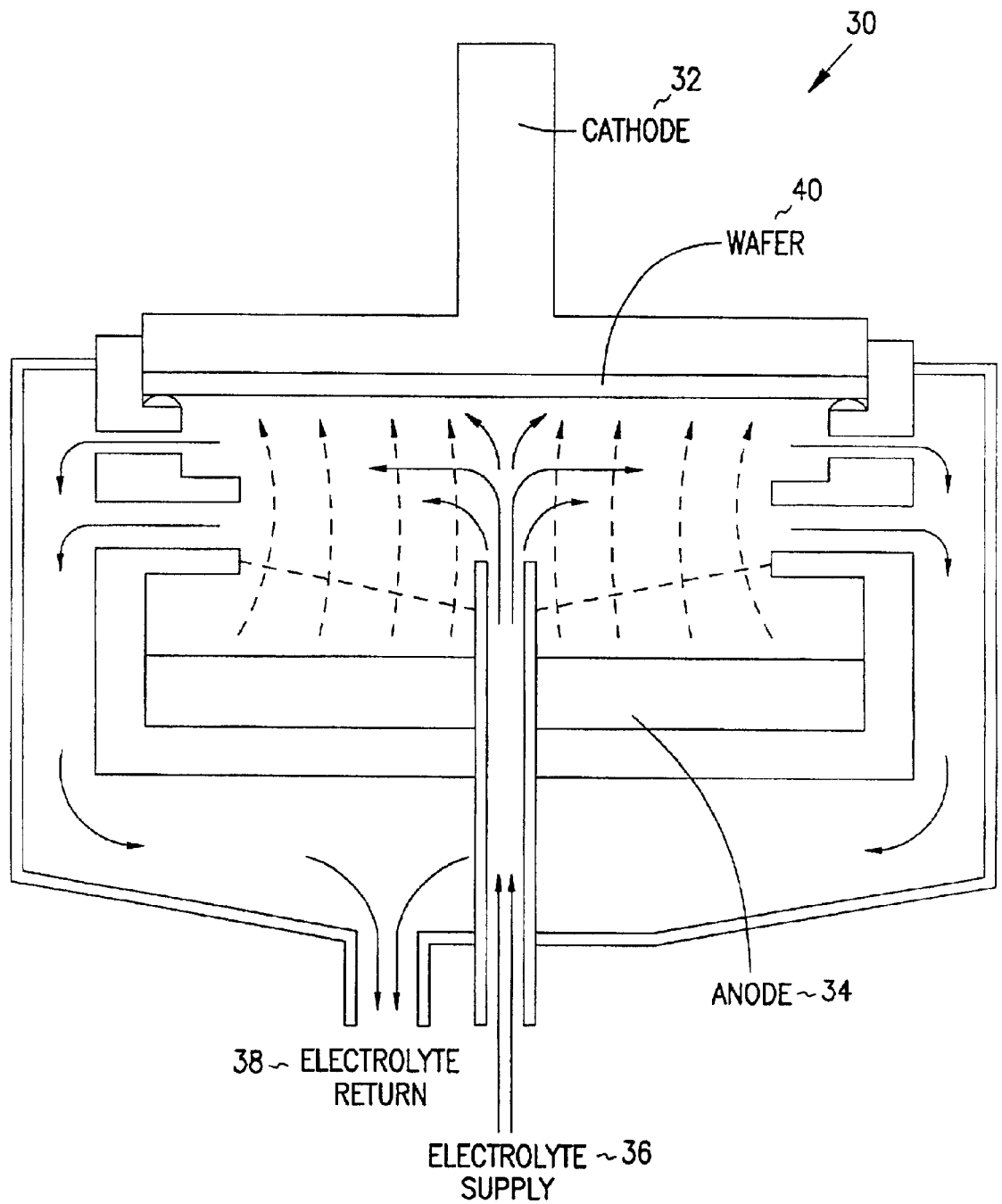
FIG. 3 is an illustration an electrochemical reaction cell.

Generally, electrochemical reaction cells of the present invention comprise a power source, a substrate cathode, an anode, and an electrolyte. FIG. 3 illustrates a typical electrochemical reaction cell 30 according to the present invention. The reaction cell 30 in FIG. 3 comprises a cathode 32, an anode 34, an electrolyte supply 36, and an electrolyte return 38. It should be understood that in reaction cells of the present invention the cathode and anode are electrically connected to an electrical power source in a manner that allows an electrical potential to be applied across the cathode and anode. Methods and apparatus for providing such an electrical connection are well understood in the art.

According to the present invention, wafer 40 is placed into the reaction cell 30 and an electrical potential is applied across the anode and the cathode. As explained in greater detail below, the application of the electrical potential may cause a reduction reaction to occur on the surface of the wafer 40 or the application of the electrical potential may cause a deposition reaction to occur on the surface of the wafer 40.

According to the present invention, cations from the electrolyte are deposited onto the surface of the wafer 40 during a deposition reaction. Thus, the deposition reaction removes cations from the electrolyte. These cations removed from the electrolyte must be eventually replenished. If the anode is made from the same material as the cations, then the cations can be replenished from the anode. FIG. 3 illustrates a mechanism for replenishing cations when they are not cations of the material from which the anode is made. FIG. 3 shows an electrolyte supply 36 containing a sufficient amount of cations. If the reaction cell 30 is used for deposition, the electrolyte exiting the cell at the electrolyte return 38 will have cations removed. The electrolyte can be transported to a cation source (not shown) to replenish the cations and then reintroduce into the reaction cell 30 through the electrolyte supply 36.

Two-electrolyte, Single-cell Embodiments

Referring now to a two-electrolyte embodiment of the present invention, a substrate comprising a deposited dual-purpose layer is placed into an electrochemical reaction cell comprising a cathode, a first anode, and a second anode. Typically, the substrate will be a silicon wafer having been photolithographically etched and covered with a dual-purpose layer. Of course, the present invention contemplates that multiple substrates or workpieces may be simultaneously subjected to embodiments of the present invention. The first anode is formed from a material that can be oxidized in the presence of the dual-purpose material. These materials can be readily identified by their oxidation potentials. Such a material will have an oxidation potential that is higher (i.e., more positive) than the oxidation potential of the dual-purpose material. Anodes useful in the present invention include anodes made from titanium, titanized platinum, platinum, and copper. For example, the oxidation potential for the oxidation of tungsten to $WO_3$ is 0.09 volts and the oxidation potential for the oxidation of tungsten to $WO_2$ is 0.12 volts. When the dual-purpose layer comprises tungsten, then the first anode is preferably formed from titanium or titanized platinum.

The electrochemical reaction cell is charged with a first electrolyte. Typically, the first electrolyte is an aqueous solution comprising a metal salt $M^+X^-$, wherein $M^+$ is the cationic species of the material used to form the first anode and $X^-$ is a counterion. For example, when the first anode is formed from titanium, the first electrolyte solution can be titanium sulfate ($Ti_2(SO_4)_3$), titanium bromide, titanium trichloride ($TiCl_3$), titanium iodide, titanium fluoride, or mixtures thereof. When the first anode is formed from titanium, preferred first electrolyte solutions are titanium trichloride and titanium sulfate. Additionally, when the first anode is formed from copper, the first electrolyte can be copper sulfate.

Generally, the concentration of the metal salt in the first electrolyte will be from about 0.1 M to about 1 M. The concentration of the metal salt in the first electrolyte may vary depending on the specific metal salt utilized, but optimum concentration ranges can be determined by a practitioner of ordinary skill in the art without undue experimentation.

The substrate is placed in the electrolyte and is electrically connected to an electrical circuit to form a cathode. The first anode is placed in the electrolyte solution and is also electrically connected to the electrical circuit. The electrical circuit is also equipped with a electrical power source. Thus, the power source, cathode, anode, and electrolyte form an electrical circuit as is known in the art. A first potential is applied to the electrical circuit. A first electrical potential between the first anode and the substrate cathode causes a reduction reaction to occur, reducing oxides on the dual-purpose layer surface. The first potential is applied with a magnitude and duration sufficient to reduce oxides on the surface of the dual-purpose layer. Typically, the magnitude of the first potential will be in the range of from about 0.1 V to about 1 V and will be applied for a time in the range of from about 1 second to about 60 seconds. These ranges may vary depending on the material used for the first anode and the specific composition of the electrolyte, but optimum ranges can be determined by a practitioner of ordinary skill in the art without undue experimentation.

After oxides on the surface of the dual-purpose layer are reduced, the first potential is no longer applied, and the first electrolyte is discharged from the electrochemical reaction cell. A second electrolyte is then introduced into the cell so that the substrate cathode and the second anode are placed in the second electrolyte. The discharging of the first electrolyte and the introduction of the second electrolyte should be done in a manner that does not expose the surface of the dual-purpose layer to conditions that would cause oxides to reform on the dual-purpose layer. One method for preventing the reformation of oxides is to keep the cell under a positive pressure of an inert gas such as nitrogen.

The second electrolyte can be any electrolyte known in the art to be useful for depositing the conductive interconnect material. In one embodiment, the second anode comprises the conductive interconnect material. Typically, the second electrolyte is an aqueous solution comprising a metal salt $M^+X_-$, wherein $M^+$ is the cationic species of the conductive interconnect material M that forms the second anode and that is to be electrochemically deposited on the surface of the dual-purpose layer and $X^-$ is a counterion. Generally, the pH of the second electrolyte will be less than about 1. For example, when the conductive interconnect material is copper, the second anode typically is formed from copper and the second electrolyte solution preferably comprises copper sulfate ($CuSO_4$), hydrochloric acid (HCl), and sulfuric acid ($H_2SO_4$). Additionally, the second electrolyte can be an electrolyte of the present invention, such as those taught below in the detailed description of embodiments of the present invention that utilize the same electrolyte for both the oxide reduction step and the conductive interconnect deposition step.

Methods for electrochemical deposition of conductive interconnect material are known in the art and can be utilized in conjunctive with the present invention. Generally, the substrate cathode and second anode are electrically connected in a manner allowing an electrical potential to be applied across the substrate cathode and the second anode. A second potential is applied to the resulting electrical circuit. Application of the second electrical potential between the second anode and the substrate cathode causes a deposition reaction to occur, depositing conductive interconnect material on the dual-purpose layer surface of the substrate. For example, when the conductive interconnect material is copper, copper ions from the electrolyte are reduced and deposited on the surface of the dual-purpose layer. The copper ions from the electrolyte are deposited or plated on the substrate via electric migration and diffusion.

Generally, the thickness of the conductive interconnect layer will be from about 2000 angstroms to about 20,000 angstroms. Preferably, the thickness of the conductive interconnect layer is from about 10,000 angstroms to about 12,000 angstroms. The amount of conductive interconnect material deposited over a period of time (and therefore, the thickness) can be controlled by controlling the amount of current flowing through the electrolyte. The voltage and the period of time for applying the voltage is selected according to the depth of the layer of conductive interconnect material to be deposited on the surface of substrate. The voltage applied is typically at least abut 0.1 V and not more than about 1 V and is typically applied for a time period of from about 30 seconds to about 5 minutes. The resulting electrical current applied is typically from about 0.5 amps to about 10 amps and has a current density of from about 5 $mA/cm^2$ to about 25 $mA/cm^2$. In some preferred embodiments, the current density will be from about 10 $mA/cm^2$ to about 15 $mA/cm^2$. Additionally, in some embodiments a current density of about 12 $mA/cm^2$ is most preferred.

Two-electrolyte, Two-cell Embodiments

In another embodiment of the present invention, two separate electrochemical reaction cells can be utilized. The reduction of oxides on the dual-purpose layer is performed in the first cell and the deposition of the conductive interconnect material is performed in the second cell. Generally, the same process parameters are used as described above, but instead of discharging the first electrolyte after the reduction of oxides and introducing the second electrolyte into the same cell, the substrate is transferred to the second cell containing the second electrolyte and second anode. The deposition of conductive interconnect material is performed in the second cell. It is important that the transfer of the substrate from the first cell to the second cell be done under conditions that does not allow for the reformation of oxides on the dual-purpose layer. Such conditions can be readily determined by a practitioner of ordinary skill in the art without undue experimentation.

Single-electrolyte, Single-cell Embodiments

In another embodiment of the present invention, a single electrolyte can be utilized in a single electrochemical reaction cell containing a single anode. In this embodiment, the composition of the electrolyte is chosen such that applying a potential across the anode and cathode first causes a reduction of oxides on the substrate cathode and then causes the deposition of the conductive interconnect material onto the substrate cathode. Accordingly, these electrolytes will be referred to as dual-purpose electrolytes since they can be utilized both for the reduction of oxides on the substrate and the deposition of the conductive interconnect material onto the substrate. However, it should be understood that dual-purpose electrolytes of the present invention may also be advantageously utilized in two electrolyte systems if so desired. For example, dual-purpose electrolytes could be used to reduce the oxides on a substrate and then a second electrolyte could be used for the deposition of the conductive interconnect material onto the substrate. The second electrolyte could be any electrolyte known in the art for depositing conductive interconnect material onto a substrate. Alternately, a dual-purpose electrolyte could be used to reduce the oxides on a substrate and deposit a thin layer of interconnect material and then a second electrolyte could be used to deposit additional interconnect material, thickening the layer of interconnect material to the resulting desired thickness. Again, the second electrolyte could be any electrolyte known in the art for depositing conductive interconnect material onto a substrate. Alternatively, a first electrolyte could be used to reduce oxides on a substrate and then a dual-purpose electrolyte used for depositing conductive interconnect material onto a substrate.

The deposition of conductive interconnect material occurs when the cation of the conductive interconnect material is reduced. For example, the deposition of copper as a conductive interconnect material occurs according to the following reduction reaction:

$$Cu^{2+}+2e^- => Cu \qquad (1)$$

Thus, when a potential is applied across the anode and cathode, $Cu^{2+}$ gets reduced, resulting in copper being deposited on the cathode. According to the present invention, oxides on a substrate surface are removed via a reduction reaction. For example, tungsten oxides can be removed according to the following reduction reaction:

$$WO_x + e^- => W \qquad (2)$$

Generally in the prior art, the reduction of conductive interconnect material cations has a lower oxidation potential (that is, a higher reduction potential) than the reduction of oxides (for example, tungsten oxide). Thus, normally when a potential is applied across an anode and cathode in an electrochemical reaction cell where an electrolyte containing a conductive interconnect material cation is present, the reduction of the cation will occur before the reduction of any oxides.

However, according to the present invention, the composition of the electrolyte can be chosen such that the reduction of oxides on the substrate cathode occurs before the reduction of conductive interconnect material cations. Electrolytes of this embodiment will also contain a cation of the conductive interconnect material along with a counterion like the second electrolyte described above. In addition, electrolytes of this embodiment will also contain a complexing agent and a pH control agent.

The amount and type of complexing agent added should be sufficient to complex the conductive interconnect material cation so that the effective reduction potential of the conductive interconnect material cation is lower than the reduction potential of the oxides. Examples of complexing agents useful in the present invention include ethylene diamine tetra acetate (EDTA), boric acid, and malonic acid. A preferred complexing agent is EDTA. Generally, the complexing agent will be present in a concentration of from about 0.01 M to about 1 M. Preferred concentrations of complexing agent used may depend on the precise complexing agent used, but can be determined by a practitioner of ordinary skill in the art without undue experimentation.

The pH control agent is utilized to keep the pH of the electrolyte greater than or equal to about 7. Preferably, the pH of the electrolyte is equal to or greater than about 10. Preferably, the pH of the electrolyte is less than or equal to about 12. Examples of pH control agents include tetramethyl ammonium hydroxide (TMAH), ammonium hydroxide ($NH_4OH$), and potassium hydroxide (KOH).

The amount of complexing agent and the amount of pH control agent present should be sufficient to lower the reduction potential (that is, raise the oxidation potential) of the cation reduction reaction until it is lower than the reduction potential (higher than the oxidation potential) of the oxide reduction reaction. Thus, when a potential is applied across the anode and cathode, oxides on the substrate surface will reduce before the conductive interconnect material cation begins to reduce and be deposited on the substrate surface.

Accordingly, in one embodiment of the present invention, a substrate cathode comprising a dual-purpose layer is placed into an electrochemical reaction cell additionally comprising an anode and an electrolyte. In one embodiment, the cations to be deposited are cations of the material from which the anode is made. For example, if it is desired to deposit a conductive interconnect material comprising copper, the electrolyte could comprise copper sulfate, for example, and the anode could comprise copper. In this manner, the copper cations that are deposited onto the surface of the dual-purpose layer can be replenished from the anode. However, the anode does not necessarily need to be made from the same material as the conductive interconnect material to be deposited. For example, in another embodiment, the anode comprises platinum. In embodiments where the cations are not comprised of the same material, the cations in the electrolyte can be replenished as explained in the text referencing FIG. 3. As indicated above, the electrolyte comprises cations of the conductive interconnect material, a counterion, a complexing agent, and a pH control agent.

The substrate cathode and the anode are electrically connected to a power source and an electrical potential is applied across the substrate cathode and the anode. This potential causes a reduction reaction to occur at the substrate cathode, reducing oxides that may be present on the dual-purpose layer of the substrate. Once the oxides are reduced, or if no oxides are present, then the potential causes the reduction of conductive interconnect material cations in the electrolyte, resulting in conductive interconnect material being deposited on the dual-purpose layer of the substrate. In this manner, conductive interconnect material can be deposited on a dual-purpose layer without having to first deposit a separate seed layer, without having to use two separate electrolytes, and without having to transfer a substrate from a first electrochemical reaction cell to a second electrochemical reaction cell.

Generally, the process parameters (applied potential, current, and current density, for example) are the same as described above for the two-electrolyte embodiments of the present invention. Again, the thickness of the conductive interconnect layer can be controlled by controlling the amount of current flowing through the electrolyte. For specific embodiments of the present invention, optimum process parameters can be determined by a practitioner having ordinary skill in the art without undue experimentation.

In one embodiment of the present invention, copper is electrochemically deposited onto a substrate having a dual-purpose surface layer by utilizing a copper anode and an electrolyte comprising copper sulfate, a complexing agent, and a pH control agent. The dual-purpose surface layer may comprise tungsten.

Once the conductive interconnect layer 19 has been electrochemically deposited on the surface of the substrate 15 with a dual-purpose layer 22, it may be desirable for some integrated circuits to transform the conductive interconnect material into an alloy. For example, it may be desirable to transform a copper interconnect into a copper alloy. Copper alloys are more resistant to electromigration than regular copper, which can be useful in some applications. In order to transform the copper into a copper alloy, small traces of impurities are implanted on the copper conductive interconnect layer, using methods of ion implantation known in the art. Examples of impurities that may be implanted to create the copper alloy include materials such as magnesium, boron, tin and zirconium. The preferred implant dose is about $1 \times 10^{16}$ atoms/cm$^2$.

After the both dual-purpose layer and the conductive interconnect layer have been deposited, the resulting workpiece optionally may be subjected to an annealing process. Sometimes during semiconductor manufacturing processes, the wafer crystal structure experiences lattice damage, damage cluster or vacancy-interstitial damage. Annealing may be necessary to correct the damage to the wafer crystal structure that may occur during processing. Methods of annealing silicon wafers to repair crystal damage are known in the art of semiconductor manufacturing. Restoration of the crystal structures that were damaged during processing can be achieved by a thermal heating step, which is commonly referred to as annealing. After any optional annealing processes are performed, a workpiece optionally may be planarized using methods known in the art such as chemical mechanical polishing (CMP).

Typically, the methods of the present invention are but a few of the steps performed in manufacturing a semiconductor device. Many other steps known in the art can be advantageously utilized in conjunction with the methods of the present invention by a practitioner of ordinary skill in the art to produce a wide variety of devices embodying the present invention.

Semiconductor Chip

Semiconductors comprising dual-purpose layers and conductive interconnect layers may be advantageously produced in accordance with the present invention. For example, semiconductor chips containing a dual-purpose layer comprising tungsten, tungsten nitride, or tungsten-silicon nitride and a conductive interconnect layer comprising copper may be manufactured in accordance with the present invention.

Memory Devices

Figure 4:
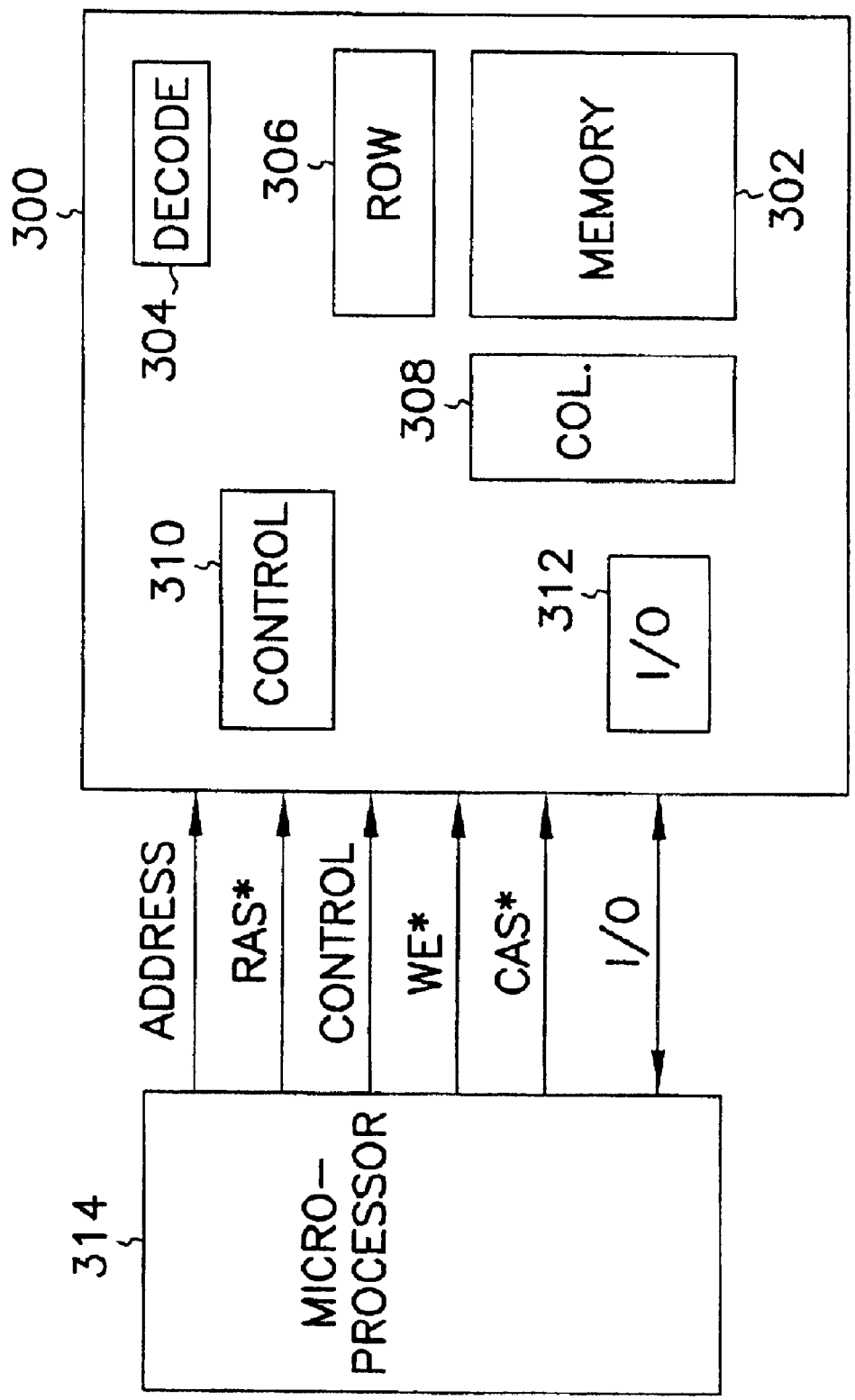
FIG. 4 is a block diagram of one embodiment of an integrated circuit memory device.

FIG. 4 is a simplified block diagram of a memory device according to one embodiment of the invention. The memory device 500 includes an array of memory cells 502, address decoder 504, row access circuitry 506, column access circuitry 508, control circuitry 510, and input/output circuitry 512. The memory can be coupled to an external microprocessor 514, or memory controller for memory accessing. The memory receives control signals from the processor 514, such as WE*, RAN* and CAVES* signals. The memory is used to store data which is accessed via I/O lines. It will be appreciated by those skilled in the art that additional circuitry and control signals can be provided, and that the memory device of FIG. 4 has been simplified to help focus on the invention. Memory cells of the present invention have a conductive interconnect made in accordance with the present invention.

It will be understood that the above description is that of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SCRAM (Synchronous Graphics Random Access Memory), SCRAM (Synchronous Dynamic Random Access Memory), SCRAM II, and DAR SCRAM (Double Data Rate SCRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 5:
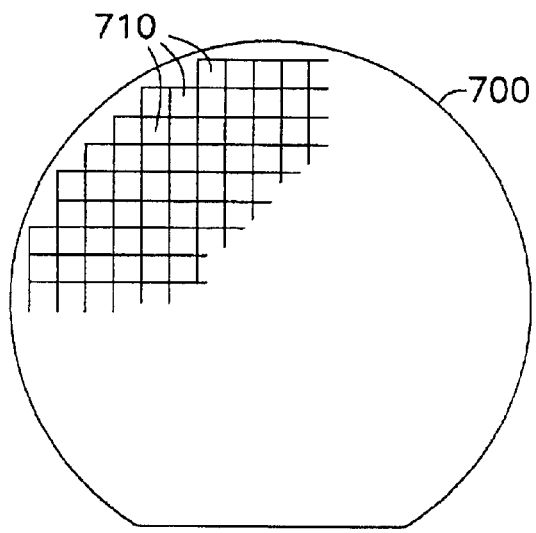
FIG. 5 is an elevation view of one embodiment of a wafer containing semiconductor dies.

FIG. 5 illustrates another embodiment of the present invention. In FIG. 5, a semiconductor die 710 is produced from a wafer 700. A die is an individual pattern, typically rectangular, on a substrate that contains circuitry, or integrated circuit devices, to perform a specific function. Semiconductor dies of the present invention comprise at least one integrated circuit device having a conductive interconnect made in accordance with the present invention. A semiconductor wafer will typically contain a repeated pattern of such dies containing the same functionality. For example, die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 6:
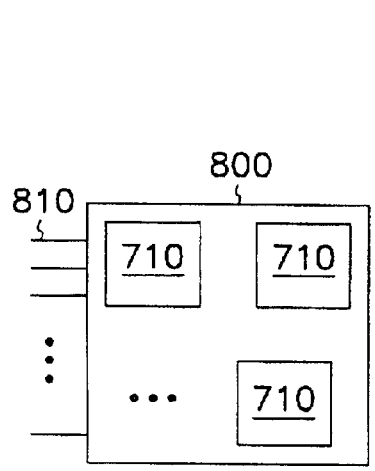
FIG. 6 is a block diagram of one embodiment of an exemplary circuit module.

As shown in FIG. 6, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Circuit modules of the present invention comprise one or more dies containing at least one conductive interconnect made in accordance with the present invention.

Examples of circuit modules include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 7:
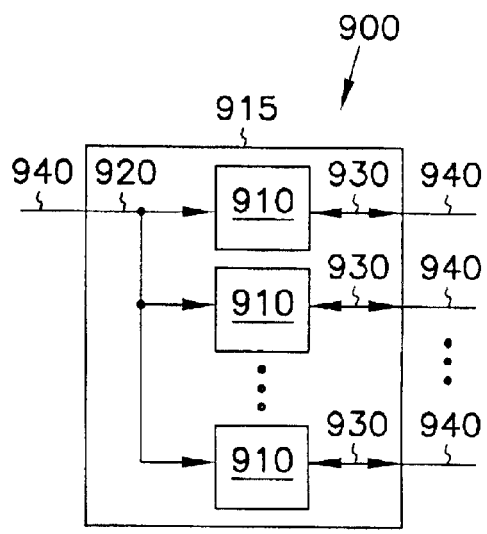
FIG. 7 is a block diagram of one embodiment of an exemplary memory module.

FIG. 7 shows one embodiment of a circuit module as memory module 900. Memory module 900 contains multiple memory devices 910 contained on support 915, the number depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 7.

Electronic Systems

Figure 8:
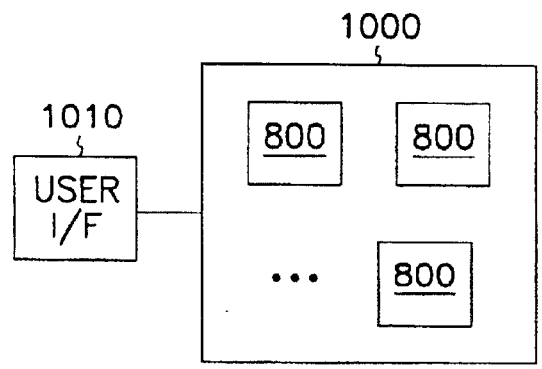
FIG. 8 is a block diagram of one embodiment of an exemplary electronic system.

FIG. 8 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 9:
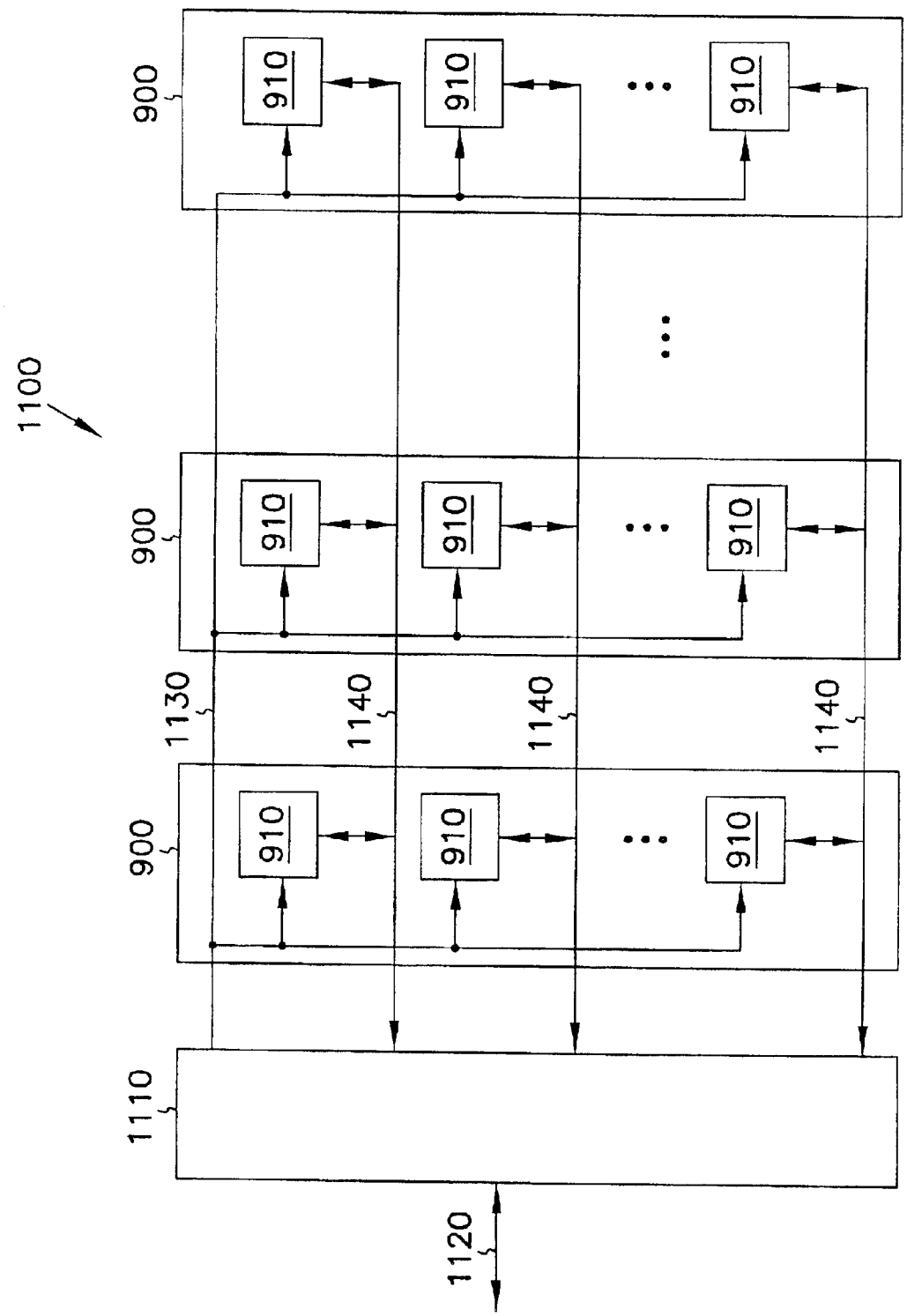
FIG. 9 is a block diagram of one embodiment of an exemplary memory system.

FIG. 9 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 10:
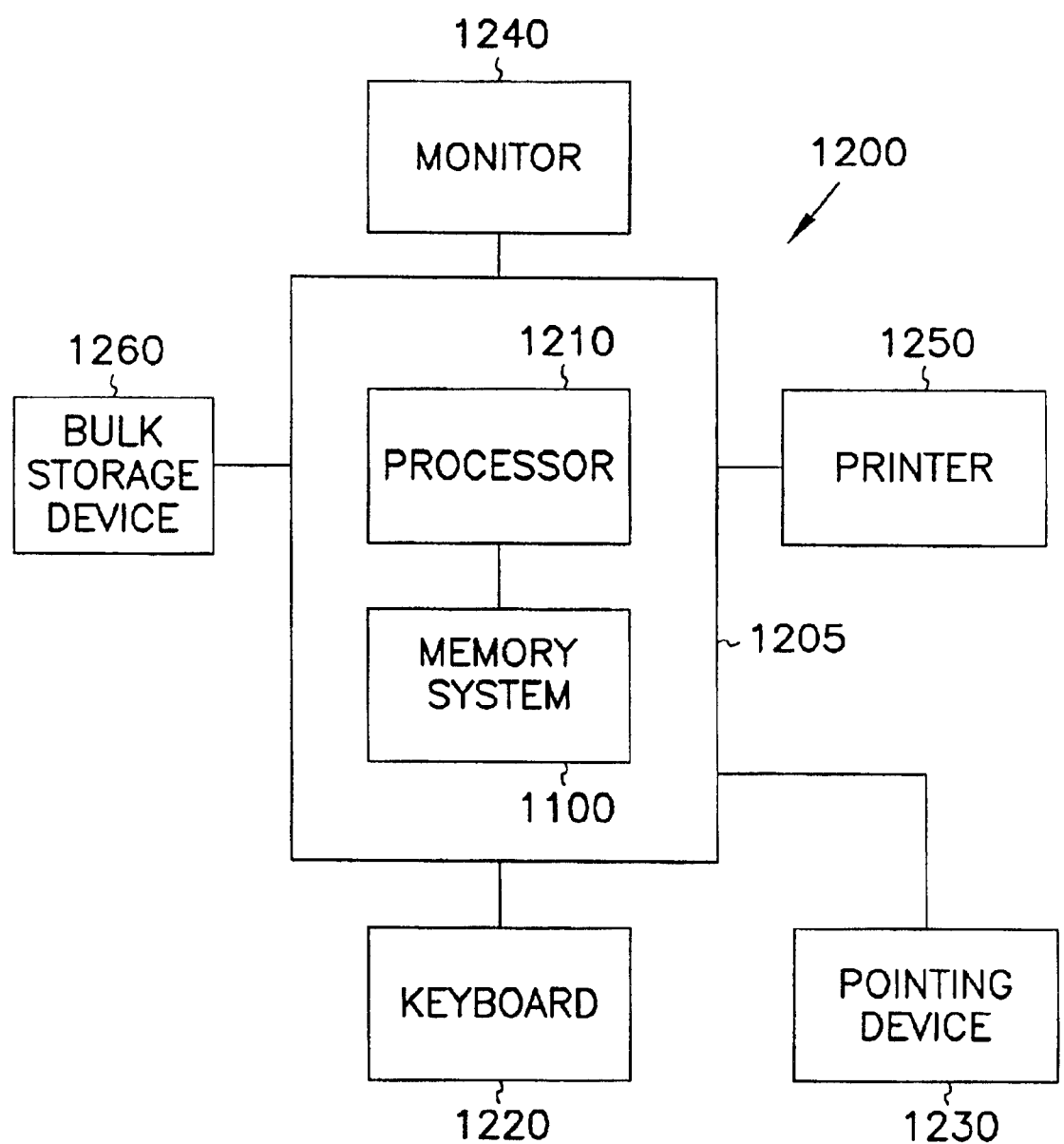
FIG. 10 is a block diagram of one embodiment of an exemplary computer system.

FIG. 10 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 10 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials and shapes, as well as other deposition and removal processes, may be utilized in conjunction with the invention. Accordingly, this application is intended to cover any adaptations or variations of the invention. It is manifestly intended that this invention be limited only by the following claims and equivalents thereof.

What is claimed is:

1. A method of metallizing a substrate, comprising:
   depositing a dual-purpose layer on the substrate wherein a first purpose is to serve as a barrier layer and a second purpose is to serve as a seed layer;
   electrochemically reducing oxides on the surface of the dual-purpose layer using a first electrolyte where the first electrolyte includes a cation species of material of an anode in an electrochemical reaction cell; and
   electrochemically depositing a conductive interconnect layer on the surface of the dual-purpose layer using a second electrolyte, wherein the conductive interconnect layer includes conductive material other than the cation species in the first electrolyte used to electrochemically reduce the oxides, wherein the anode is formed from titanium or titanium/platinum.

2. The method of claim 1, wherein the dual-purpose layer comprises a material capable of reducing diffusion of the conductive interconnect material into surrounding materials, and wherein the dual-purpose layer comprises a material having a resistivity that allows electrochemical deposition of the conductive interconnect material.

3. The method of claim 1, wherein the dual-purpose layer comprises a material selected from the group consisting of tungsten, tungsten nitride, and tungsten-silicon nitride.

4. The method of claim 1, wherein the material comprising the dual-purpose layer comprises tungsten.

5. The method of claim 1, wherein the conductive interconnect material comprises copper.

6. The method of claim 1, wherein a voltage of at least about 0.1 V and not more than about 1 V is applied during both the electrochemically reducing step and the electrochemically depositing step for a time period of from about 30 seconds to about 5 minutes.

7. The method of claim 1, wherein a current of from about 0.5 amps to about 10 amps and having a current density of from about 5 mA/cm2 to about 25 mA/cm2 is applied during both the electrochemically reducing step and the electrochemically depositing step.

8. The method of claim 1, wherein a current of from about 0.5 amps to about 10 amps and having a current density of from about 10 mA/cm2 to about 15 mA/cm2 is applied during both the electrochemically reducing step and the electrochemically depositing step.

9. The method of claim 1, wherein a current of from about 0.5 amps to about 10 amps and having a current density of about 12 mA/cm2 is applied during both the electrochemically reducing step and the electrochemically depositing step.

10. A method of metallizing a substrate, comprising:
    depositing a dual-purpose layer on the substrate wherein a first purpose is to serve as a barrier layer and a second purpose is to serve as a seed layer;
    electrochemically reducing oxides on the surface of the dual-purpose layer in an electrochemical reaction cell comprising an anode formed from a material that can be oxidized in the presence of the material comprising the dual-purpose layer;
    electrochemically depositing a conductive interconnect layer on the surface of the dual-purpose layer; and wherein the electrochemical reaction cell contains a first electrolyte comprising the cation of the material used to form the anode, and the conductive interconnect layer includes conductive material other than the cation species in the first electrolyte used to electrochemically reduce the oxides, wherein the anode is formed from titanium or titanium/platinum.

11. The method of claim 10, wherein the anode comprises titanium and the first electrolyte comprises titanium trichloride, titanium sulfate, titanium bromide, titanium trichloride, titanium iodide, titanium fluoride, or mixtures thereof.

12. The method of claim 11, wherein the first electrolyte comprises titanium trichloride or titanium sulfate.

13. A method of metallizing a substrate, comprising:
depositing a dual-purpose layer on the substrate wherein the dual-purpose layer serves as a barrier layer and a seed layer;
electrochemically reducing oxides on the surface of the dual-purpose layer utilizing a first electrolyte in an electrochemical bath having an anode and a cathode;
electrochemically depositing a conductive interconnect layer on the surface of the dual-purpose layer utilizing a second electrolyte; and
wherein the first electrolyte contains the cationic species of the material comprising the first anode, and the conductive interconnect layer includes conductive material other than the cation species in the first electrolyte used to electrochemically reduce the oxides, wherein the anode is formed from titanium, platinum, or titanium/platinum.

14. The method of claim 13, wherein the electrochemically reducing step is performed in a first electrochemical reaction cell and the electrochemically depositing step is performed in a second electrochemical reaction cell.

15. The method of claim 13, wherein the electrochemically reducing step and the electrochemically depositing step are performed in a single electrochemical reaction cell.

16. The method of claim 13, wherein the electrochemical reducing step is performed using a first anode and the electrochemical depositing step is performed using a second anode.

17. The method of claim 13, wherein the electrochemical reducing step and the electrochemical depositing step are performed using a single anode.

18. The method of claim 13, wherein the dual-purpose layer comprises a material selected from the group consisting of tungsten, tungsten nitride, and tungsten-silicon nitride.

19. The method of claim 13, wherein the material comprising the dual-purpose layer comprises tungsten.

20. The method of claim 13, wherein the conductive interconnect material comprises copper.

21. The method of claim 13, wherein the first anode comprises a material that can be oxidized in the presence of the material comprising the dual-purpose layer.

22. The method of claim 13, wherein the anode is formed from titanium or titanium/platinum.

23. The method of claim 13, wherein a voltage of at least about 0.1 V and not more than about 1 V is applied during both the electrochemically reducing step and the electrochemically depositing step for a time period of from about 30 seconds to about 5 minutes.

24. The method of claim 13, wherein a current of from about 0.5 amps to about 10 amps and having a current density of from about 5 mA/cm2 to about 25 mA/cm2 is applied during both the electrochemically reducing step and the electrochemically depositing step.

25. The method of claim 13, wherein a current of from about 0.5 amps to about 10 amps and having a current density of from about 10 mA/cm2 to about 15 mA/cm2 is applied during both the electrochemically reducing step and the electrochemically depositing step.

26. The method of claim 13, wherein a current of from about 0.5 amps to about 10 amps and having a current density of about 12 mA/cm2 is applied during both electrochemically reducing step and the electrochemically depositing step.

27. A method of metallizing a substrate, comprising;
depositing a dual-purpose layer on the substrate wherein the dual-purpose layer serves as a barrier layer and a seed layer;
electrochemically reducing oxides on the surface of the dual-purpose layer utilizing a first electrolyte;
electrochemically depositing a conductive interconnect layer on the surface of the dual-purpose layer utilizing a second electrolyte; and
wherein the first electrolyte comprises titanium sulfate, titanium bromide, titanium trichloride, titanium iodide, titanium fluoride, or mixtures thereof, wherein an anode used to electrochemically reduce oxides is formed from titanium/platinum.

28. A method of metallizing a substrate, comprising:
depositing a dual-purpose layer on the substrate wherein the dual-purpose layer serves as a barrier layer and a seed layer;
electrochemically reducing oxides on the surface of the dual-purpose layer utilizing a first electrolyte in an electrochemical cell having an anode;
electrochemically depositing a conductive interconnect layer on the surface of the dual-purpose layer utilizing a second electrolyte; and
wherein the first anode is formed from titanium and the first electrolyte is titanium chloride or titanium sulfate.

29. A method of metallizing a substrate, comprising:
depositing a dual-purpose layer on the substrate wherein the dual-purpose layer serves as a barrier layer and a seed layer;
electrochemically reducing oxides on the surface of the dual-purpose layer utilizing a first electrolyte where the first electrolyte includes a cation species of material of an anode in an electrochemical reaction cell, wherein the anode is formed from titanium or titanium/platinum;
electro chemically depositing a conductive interconnect layer on the surface of the dual-purpose layer utilizing a second electrolyte, the conductive interconnect layer including conductive material other than a cation species in the first electrolyte used to electrochemically reduce the oxides; and
wherein the second electrolyte comprises:
the cation of the material from which the conductive interconnect layer is made;
a complexing agent; and
a pH control agent.

30. The method of claim 29, wherein the conductive interconnect layer comprises copper and the second electrolyte comprises copper sulfate.

31. The method of claim 29, wherein the complexing agent is selected from the group consisting of ethylene diamine tetra acetate, boric acid, and malonic acid.

32. The method of claim 29, wherein the complexing agent is ethylene diamine tetra acetate.

33. The method of claim 29, wherein the pH control agent is tetramethyl ammonium hydroxide, ammonium hydroxide, or potassium hydroxide.

34. The method of claim 29, wherein the pH control agent is tetramethyl ammonium hydroxide.

35. The method of claim 29, wherein the electrolyte exhibits a pH greater than about 7.

36. The method of claim 29, wherein the electrolyte exhibits a pH greater than or equal to about 10.

37. The method of claim 29, wherein the electrolyte exhibits a pH greater than about 7 and less than or equal to about 12.

38. The method of claim 29, wherein the electrolyte exhibits a pH greater than about 10 and less than or equal to about 12.

39. A method of metallizing a substrate, comprising:

depositing a dual-purpose layer on the substrate wherein the dual-purpose layer serves as a barrier layer and a seed layer;

electrochemically reducing oxides on the surface of the dual-purpose layer;

electrochemically depositing a conductive interconnect layer on the surface of the dual-purpose layer, wherein both the electrochemically reducing step and the electrochemically depositing step are performed in a single electrochemical reaction cell utilizing a single electrolyte where the single electrolyte includes a cation species of material of an anode in the electrochemical reaction cell, wherein the anode is formed from titanium, platinum, or titanium/platinum;

wherein the electrolyte comprises:

the cation of the material from which the conductive interconnect material is made;

a complexing agent; and a pH control agent; and injecting a second electrolyte into the single electrochemical reaction cell after electrochemically depositing the conductive interconnect layer to an initial thickness to deposit additional material to thicken the layer of conductive interconnect layer to a selected thickness.

40. The method of claim 39, wherein the dual-purpose layer comprises tungsten.

41. The method of claim 39, wherein the complexing agent is selected from the group consisting of ethylene diamine tetra acetate, boric acid, and malonic acid.

42. The method of claim 39, wherein the pH control agent is tetramethyl ammonium hydroxide, ammonium hydroxide, or potassium hydroxide.

43. The method of claim 39, wherein the pH control agent is tetramethyl ammonium hydroxide.

44. The method of claim 39, wherein the electrolyte exhibits a pH greater than about 7.

45. The method of claim 39, wherein the electrolyte exhibits a pH greater than or equal to about 10.

46. The method of claim 39, wherein the electrolyte exhibits a pH greater than about 7 and less than or equal to about 12.

47. The method of claim 39, wherein the electrolyte exhibits a pH greater than about 10 and less than or equal to about 12.

48. The method of claim 39, wherein a voltage of at least about 0.1 V and not more than about 1 V is applied during both the electrochemically reducing step and the electrochemically depositing step for a time period of from about 30 seconds to about 5 minutes.

49. The method of claim 39, wherein a current of from about 0.5 amps to about 10 amps and having a current density of from about 5 mA/cm2 to about 25 mA/cm2 is applied during both the electrochemically reducing step and the electrochemically depositing step.

50. The method of claim 39, wherein a current of from about 0.5 amps to about 10 amps and having a current density of from about 10 mA/cm2 to about 15 mA/cm2 is applied during both the electrochemically reducing step and the electrochemically depositing step.

51. The method of claim 39, wherein a current of from about 0.5 amps to about 10 amps and having a current density of about 12 mA/cm2 is applied during both the electrochemically reducing step and the electrochemically depositing step.

52. A method of metallizing a substrate, comprising:

depositing a dual-purpose layer on the substrate wherein the dual-purpose layer serves as a barrier layer and a seed layer;

electrochemically reducing oxides on the surface of the dual-purpose layer;

electrochemically depositing a conductive interconnect layer on the surface of the dual-purpose layer, wherein both the electrochemically reducing step and the electrochemically depositing step are performed in a single electrochemical reaction cell utilizing a single electrolyte where the single electrolyte includes a cation species of material of an anode in an electrochemical reaction cell, wherein the anode is formed from titanium or titanium/platinum;

wherein the electrolyte comprises:

the cation of the material from which the conductive interconnect material is made;

a complexing agent; and a pH control agent; and wherein the conductive interconnect material comprises copper and the electrolyte comprises copper sulfate.

53. A method of metallizing a substrate, comprising:

depositing a dual-purpose layer on the substrate wherein the dual-purpose layer serves as a barrier layer and a seed layer;

electrochemically reducing oxides on the surface of the dual-purpose layer;

electrochemically depositing a conductive interconnect layer on the surface of the dual-purpose layer, wherein both the electrochemically reducing step and the electrochemically depositing step are performed in a single electrochemical reaction cell utilizing a single electrolyte where the single electrolyte includes a cation species of material of an anode in an electrochemical reaction cell;

wherein the electrolyte comprises:

the cation of the material from which the conductive interconnect material is made;

a complexing agent; and a pH control agent; and wherein the complexing agent is ethylene diamine tetra acetate, wherein the anode is formed from titanium, platinum, or titanium/platinum.

54. The method of claim 53, wherein the anode is formed from titanium or titanium/platinum.

* * * * *

UNITED STATES PATENT AND TRADEMARK OFFICE
CERTIFICATE OF CORRECTION

PATENT NO. : 6,852,618 B2
DATED : February 8, 2005
INVENTOR(S) : Chopra

It is certified that error appears in the above-identified patent and that said Letters Patent is hereby corrected as shown below:

Column 7,
Line 51, delete "$M^+X\_$" and insert -- $M^+X^-$ --, therefor.

Column 14,
Line 44, delete "5 mA/cm2" and insert -- 5 mA/cm$^2$ --, therefor.
Line 44, delete "25 mA/cm2" and insert -- 25 mA/cm$^2$ --, therefor.
Line 49, delete "10 mA/cm2" and insert -- 10 mA/cm$^2$ --, therefor.
Line 49, delete "15 mA/cm2" and insert -- 15 mA/cm$^2$ --, therefor.
Line 54, delete "12 mA/cm2" and insert -- 12 mA/cm$^2$ --, therefor.

Column 15,
Line 65, delete "5 mA/cm2" and insert -- 5 mA/cm$^2$ --, therefor.
Line 65, delete "25 mA/cm2" and insert -- 25 mA/cm$^2$ --, therefor.

Column 16,
Line 3, delete "10 mA/cm2" and insert -- 10 mA/cm$^2$ --, therefor.
Line 3, delete "15 mA/cm2" and insert -- 15 mA/cm$^2$ --, therefor.
Line 8, delete "12 mA/cm2" and insert -- 12 mA/cm$^2$ --, therefor.
Line 11, delete ";" and insert -- : --, therefor.
Line 49, delete "electro chemically" and insert -- electrochemically --, therefor.

Column 18,
Line 3, delete "5 mA/cm2" and insert -- 5 mA/cm$^2$ --, therefor.
Line 3, delete "25 mA/cm2" and insert -- 25 mA/cm$^2$ --, therefor.
Line 8, delete "10 mA/cm2" and insert -- 10 mA/cm$^2$ --, therefor.
Line 8, delete "15 mA/cm2" and insert -- 15 mA/cm$^2$ --, therefor.
Line 13, delete "12 mA/cm2" and insert -- 12 mA/cm$^2$ --, therefor.

Signed and Sealed this

Thirty-first Day of May, 2005

JON W. DUDAS
*Director of the United States Patent and Trademark Office*